(12) United States Patent  
Yamanaka et al.

(10) Patent No.: US 9,153,950 B2
(45) Date of Patent: Oct. 6, 2015

(54) WIRE LEAD-IN DEVICE

(71) Applicant: Yanegijutsukenkyujo Co., Ltd., Takahama-shi, Aichi (JP)

(72) Inventors: Takayoshi Yamanaka, Takahama (JP); Katsuyuki Okado, Takahama (JP); Shuichi Kobayashi, Takahama (JP)

(73) Assignee: YANEGIJUTSUKENKYUJO CO., LTD., Takahama-Shi (JP)

( * ) Notice: Subject to any disclaimer, the term of this patent is extended or adjusted under 35 U.S.C. 154(b) by 0 days.

(21) Appl. No.: 14/296,210

(22) Filed: Jun. 4, 2014

(65) Prior Publication Data

US 2014/0284098 A1 Sep. 25, 2014

Related U.S. Application Data

(63) Continuation of application No. PCT/JP2012/079964, filed on Nov. 19, 2012.

(30) Foreign Application Priority Data

Dec. 21, 2011 (JP) ................................. 2011-280238

(51) Int. Cl.
*H02G 3/22* (2006.01)
*H01L 31/05* (2014.01)
*E04D 13/00* (2006.01)
*H02S 20/23* (2014.01)
*E04D 1/30* (2006.01)

(52) U.S. Cl.
CPC .................. *H02G 3/22* (2013.01); *E04D 13/00* (2013.01); *H01L 31/05* (2013.01); *H02S 20/23* (2014.12); *E04D 2001/307* (2013.01); *Y02B 10/12* (2013.01); *Y02E 10/50* (2013.01)

(58) Field of Classification Search
CPC .......... H02G 3/22; H02S 20/23; E04D 13/00; H01L 31/05; Y02B 10/12; Y02E 10/50
USPC .......................................... 174/650; 52/220.8
See application file for complete search history.

(56) References Cited

U.S. PATENT DOCUMENTS 6,245,987 B1 * 6/2001 Shiomi et al. .................. 136/244
7,786,391 B1 * 8/2010 Van Pelt et al. ............... 174/659
8,695,291 B2 * 4/2014 Pisklak et al. ............... 52/173.3

FOREIGN PATENT DOCUMENTS

JP 2-243866 A 9/1990
JP 11-2179 A 1/1999

(Continued)

OTHER PUBLICATIONS

International Search Report (in English) corresponding to International Application No. PCT/JP2012/079964 mailed on Jan. 15, 2013.

*Primary Examiner* — Dhirubhai R Patel
(74) *Attorney, Agent, or Firm* — Yoshida & Associates, LLC

(57) ABSTRACT

A wire lead-in device for leading wires into a building from the upper side of a roofing material laid on a roof structural member includes a main body having a transversely long plate-like base part that is mounted on the roofing material, an insertion hole that penetrates through the base part and through which the wires are capable of being inserted, a peripheral wall that surrounds the wires passing through the insertion hole and extending to an eaves side from right, left, and ridge sides, and extends upward from the base part, and of which lower ends are inclined upward toward the eaves side, and an inclined bottom wall that couples the inclined lower ends of the peripheral wall, and a lid member that is detachably mounted on the main body and is capable of closing an upper opening of the peripheral wall.

4 Claims, 7 Drawing Sheets

(56) References Cited

FOREIGN PATENT DOCUMENTS

| JP | 2000-166063 A | 6/2000 |
| JP | 2001-311279 A | 11/2001 |
| JP | 2008-266977 A | 11/2008 |
| JP | 2011-208446 A | 10/2011 |

* cited by examiner

WIRE LEAD-IN DEVICE

CROSS REFERENCE TO RELATED APPLICATIONS

This application is a continuation of International Application No. PCT/JP2012/079964 filed on Nov. 19, 2012, claiming priority upon Japanese Patent Application No. 2011-280238 filed Dec. 21, 2011 of which full contents are incorporated herein by reference.

BACKGROUND OF THE INVENTION

1. Field of the Invention

The present invention relates to a wire lead-in device for leading wires such as distributing cables of solar cell modules into a building from the upper side of a roofing material laid on a roof structural member.

2. Description of the Related Art

The present applicant has proposed a wire lead-in device (wire lead-in tool) for leading wires such as distributing cables from solar cell modules and an antenna cable from a television antenna into a building from the upper side of a roofing material laid on a roof structural member such as rafter and a roofboard configuring a roof of the building (See, Japanese Patent Application Laid-open No. 2008-266977). The wire lead-in device includes a main body and a cover. The main body has a box shape extending in the roof flow direction (inclined direction) and is opened upward and toward the eaves. The cover covers the upper opening of the main body. An insertion hole through which the wires can be inserted is formed in the main body of the wire lead-in device in the vicinity of an end portion at the ridge side. Further, the box-shaped main body of the wire lead-in device includes a flange-form mounting part extending from the longer side of the bottom portion in the direction orthogonal to the roof flow direction. The mounting part is mounted on the roofing material, so that the main body is mounted on the roofing material.

The above-mentioned wire lead-in device can lead the wires into the building from the upper side of the roof in the following manner. That is, the main body of the wire lead-in device is mounted on the roofing material such that the insertion hole is matched with a through-hole formed on the roofing material and the wires are extended into the building through the insertion hole in the main body and the through-hole from the opened eaves-side end portion of the main body. The wire lead-in device can prevent rainwater from entering the building through the insertion hole with the box-shaped main body extending in the roof flow direction.

The conventional wire lead-in device has the bottom surface of the main body, which is a flat surface extending in the roof flow direction. This arises a problem that the main body cannot be mounted on the roofing material when the roofing material formed by a metal plate (metal roof) or the roofing material having a bent part or a step with respect to the roof flow direction is used. To be specific, for example, when the metal roof is laid on the roof structural member such as the roofboard in a horizontal roofing manner, the metal roof is inclined such that a space between the metal roof and the roofboard becomes larger toward the eaves side from the ridge side when focusing one metal roof. When the wire lead-in device is mounted on the metal roof in this state, the inclined thin metal roof is pressed by the bottom surface of the wire lead-in device so as to be in parallel with the roofboard and the metal roof is largely bent by the eaves-side end portion of the wire lead-in device. If the metal roof is bent, there arises a problem that the strength of the metal roof is lowered.

Further, in this case, there is a risk that a ridge-side portion (coupling part coupling the metal roofs) of the metal roof located at the eaves side is crushed by the bottom surface of the wire lead-in device. If the place is crushed, there arises a problem that waterproof performance of the metal roof is lowered significantly. For this reason, the wire lead-in device cannot be mounted, resulting in a problem.

Therefore, for example, there is a problem that even if a user desires to install the solar cell module on roof, the user gives up installing the solar cell module because the wire lead-in device cannot be mounted. Alternatively, there is the following problem. That is, the cost for installation of the solar cell module is largely increased if the roofing material is replaced such that the wire lead-in device can be mounted for installing the solar cell module. In addition, in the conventional wire lead-in device, the opening on the eaves-side end portion through which the wire is led out is formed over the substantially entire height of the main body. This arises a risk that rainwater enters from the eaves-side end portion.

SUMMARY OF THE INVENTION

In view of the above-mentioned circumstances, an object of the present invention is to provide a wire lead-in device that can be mounted on roofing materials of the larger number of types and can prevent entrance of rainwater and the like as less as possible.

In order to achieve the above-mentioned object, a wire lead-in device according to an aspect of the invention "for leading a wire into a building from above a roofing material laid on a roof structural member includes a main body having a transversely long plate-like base part that is mounted on the roofing material, an insertion hole that penetrates through the base part and through which the wire is capable of being inserted, a peripheral wall that surrounds the wire passing through the insertion hole and extending to an eaves side on the roofing material from right, left, and ridge sides, extends upward from an upper surface of the base part, and extends to the eaves side relative to an eaves-side edge of the base part, and of which lower ends of portions extending to the eaves side relative to the eaves-side edge are inclined upward toward the eaves side, and a plate-like inclined bottom wall that couples the inclined lower ends of the peripheral wall and extends from the eaves-side edge of the base part to the eaves side, and a lid member that is detachably mounted on the main body and is capable of closing an upper opening of the peripheral wall."

As the "roofing material", a "metal roof", a "slate", an "asphalt shingle", a "fiber glass shingle", a "color best" a "clay roof tile", and a "concrete roof tile", can be exemplified.

As the "wire", a "distributing cable that is connected to a solar cell module", an "antenna cable that is connected to an antenna", a "distributing cable that is connected to a wind power generation device", a "cable that is connected to an illumination device", a "power cable that is connected to a power line such as an electrical wire", a "distributing pipe that is connected to a solar water heater, a sprinkler, or the like", a "pipe that is connected to an air conditioner", "other pipes such as a gas pipe", and the like can be exemplified.

In the wire lead-in device according to the aspect of the invention, the base part of the main body that is placed on the roofing material has a shape extending in the transverse direction, that is, the direction orthogonal to the roof flow direction. Therefore, the length of the base part abutting against the roofing material in the roof flow direction can be made shorter than that in the conventional technique. Further, the wire lead-in device includes the inclined bottom wall formed by inclining the lower ends of the peripheral wall extending from the eaves-side edge of the base part to the eaves side. Therefore, the size of the opening that is formed by the peripheral wall and an eaves-side end portion of the inclined bottom wall of the main body and an eaves-side end portion of the lid member and through which the wire passes can be made smaller than the total height of the wire lead-in device. Therefore, rainwater can be made difficult to enter the inner portion from the eaves-side end portion. Further, the wire lead-in device includes the inclined bottom wall inclined upward from the eaves-side edge of the base part, so that the opening on the eaves-side end portion can be located at the upper side relative to the roofing material. This can make rainwater difficult to enter the inner portion through the opening.

Further, the wire lead-in device includes the inclined bottom wall formed by inclining the lower ends of the peripheral wall extending to the eaves side from the eaves-side edge of the base part. Therefore, the wire lead-in device can be mounted even on the roofing material having a bent part or a step with respect to the roof flow direction with no problem because the inclined portions of the inclined bottom wall are separated from the roofing material.

Further, as described above, the wire lead-in device is configured such that the length of the base part in the roof flow direction is made shorter and the lower ends of the peripheral wall extending to the eaves side from the eaves-side edge of the base part are inclined. Therefore, even when the wire lead-in device is mounted on the metal roof as the roofing material, large bending of the metal roof and crushing of a coupling part between the metal roofs can be avoided. This enables the wire lead-in device to be mounted even on the metal roof preferably.

Further, in the wire lead-in device, the opening on the eaves-side end portion through which the wire is made to extend over the roofing material is located at the upper position relative to the roofing material. Therefore, the wire can be made to extend to the eaves side from a high position separated from the roofing material, so that the wire extending to the eaves side through the opening can be made difficult to touch the roofing material in comparison with the conventional wire lead-in device. This can prevent the wire from making contact with the roofing material, from being abraded or being eroded by rainwater collected between the wire and the roofing material. To be specific, for example, when the wire is a cable such as a power line, if the cable makes contact with the roofing material, coating of the cable is easy to be damaged due to friction or the like. The damage of the coating causes generation of leakage, short circuit, or the like. Further, there is a risk that the leakage or the like causes generation of fire. However, the wire can be made difficult to touch the roofing material as describe above, so that the coating of the cable can be less likely to be damaged. This can avoid generation of leakage and short circuit, and eventually fire, thereby enhancing endurance and safety.

Accordingly, the wire lead-in device can be mounted on the roofing materials of the larger number of types and can prevent entrance of rainwater and the like as less as possible.

Further, in the wire lead-in device according to the aspect of the invention, it is preferable that "the main body further include a cylindrical guide part that extends downward from an peripheral edge of the insertion hole below a lower surface of the base part and through which the wire is inserted" in addition to the above configuration.

Meanwhile, when the conventional wire lead-in device is mounted on the roofing material, the through-hole of the roofing material and the insertion hole of the main body are matched, a sleeve is inserted to be fitted into the through hole of the roofing material and the insertion hole of the main body, and the surrounding of the sleeve is sealed by a sealing member formed by butyl rubber, silicone, or the like for waterproofing. It requires troublesome task to mount the wire lead-in device and the number of parts and the cost is increased, resulting in a problem.

On the other hand, the wire lead-in device according to the aspect of the invention includes the cylindrical guide part extending downward from the insertion hole integrally with the main body. Therefore, the number of parts in the wire lead-in device can be reduced, thereby suppressing the increase in the cost.

Further, the wire lead-in device includes the cylindrical guide part extending downward from the insertion hole integrally with the main body, so that the insertion hole of the main body can be matched with the through-hole of the roofing material only by inserting the guide part into the through-hole. Further, the wire lead-in device includes the guide part integrally with the main body, thereby reducing the number of places sealed by the sealing member or the like for waterproofing in comparison with the conventional technique. Accordingly, the wire lead-in device can be mounted on the roofing material easily so as to reduce the work period and the cost required for mounting and the like in comparison with the conventional technique.

Further, in the wire lead-in device according to the aspect of the invention, it is preferable that "the lid member include a drooping wall that extends downward at the eaves side relative to an eaves-side end portion of the main body and is capable of guiding downward the wire extending to the eaves side from the eaves-side end portion of the main body" in addition to the above configuration.

Meanwhile, the conventional wire lead-in device has such shape that the inner part of the cover covering the upper opening of the main body extends straight to the eaves side along the roof flow direction. Therefore, the conventional wire lead-in device has a configuration in which rainwater blown up to the ridge side from the eaves side tend to enter the main body easily. In addition, in the conventional wire lead-in device, the wire extending from the eaves-side end portion extends along the roof structural member. This arises a risk that rainwater enter the inner portion while flowing down the wire.

In contrast, in the wire lead-in device according to the aspect of the invention, the lid member includes the drooping wall that extends downward from the eaves side relative to the eaves-side end portion of the main body. Therefore, the opening on the eaves-side end portion through which the wire extends in the wire lead-in device can be made small further. With this, rainwater can be made difficult to enter the inner portion from the eaves-side end portion.

In addition, with the wire lead-in device, the drooping wall of the lid member is capable of guiding the wire so as to extend downward. This can increase the inclination angle relative to the roofing material of the wire extending to the eaves side from the eaves-side end portion in comparison with the conventional wire lead-in device. With this, rainwater can be made difficult to enter the inner portion while flowing down the wire.

Further, in the wire lead-in device according to the aspect of the invention, it is preferable that "the main body further include a cylindrical bank part that extends upward from a peripheral edge of the insertion hole above an upper surface of the base part so as to be lower than the peripheral wall" in addition to the above configuration.

The wire lead-in device according to the aspect of the invention can prevent entrance of rainwater into the insertion hole by the bank part that extends from the peripheral edge of the insertion hole even when the rainwater enter the inner portion of the main body accidentally. This can enhance reliability for waterproofing in the wire lead-in device.

As described above, the present invention can provide the wire lead-in device that can be mounted on roofing materials of the larger number of types and can prevent entrance of rainwater and the like as less as possible.

DESCRIPTION OF THE EMBODIMENTS

Figure 1:
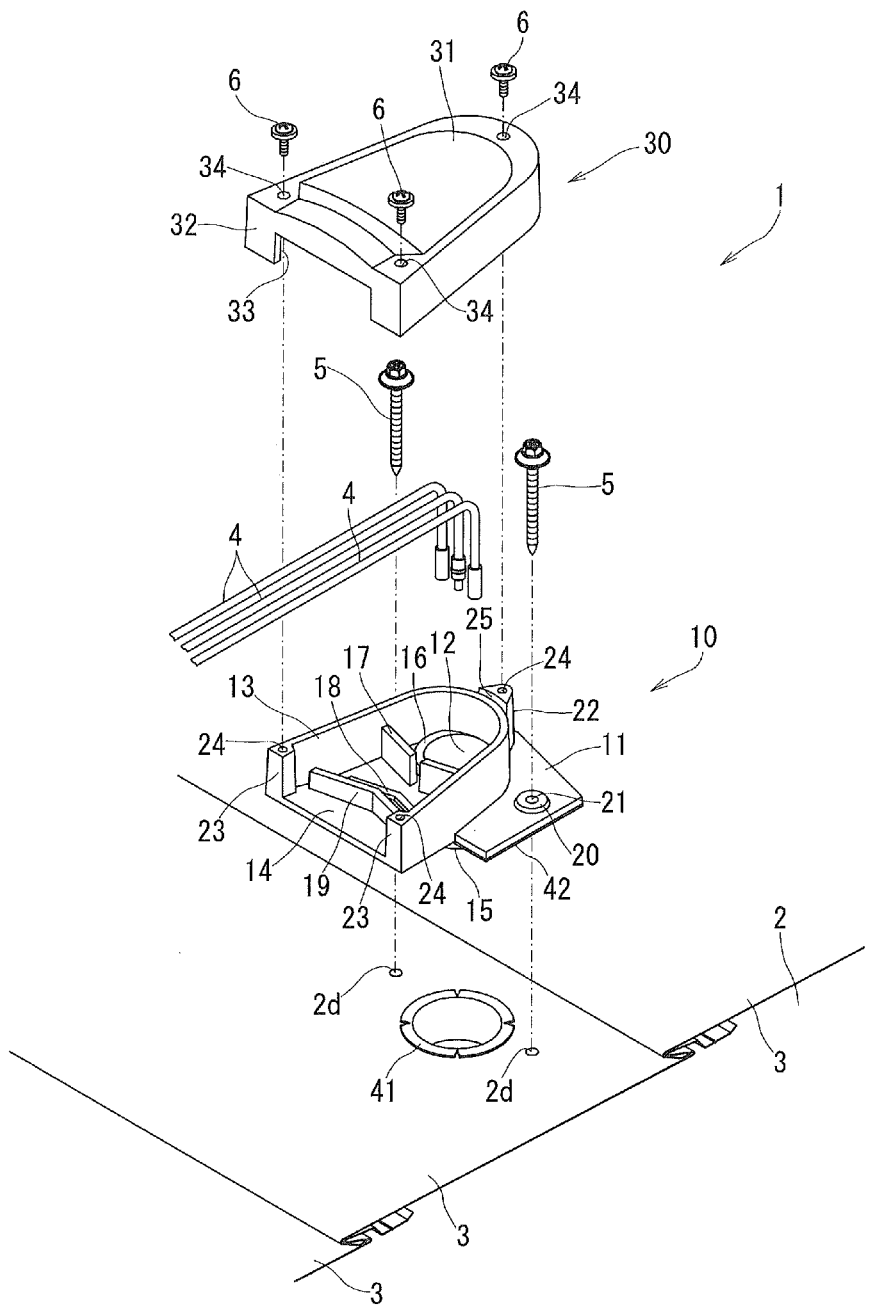
FIG. 1 is an exploded perspective view illustrating a wire lead-in device according to an embodiment of the present invention.
Figure 2A:
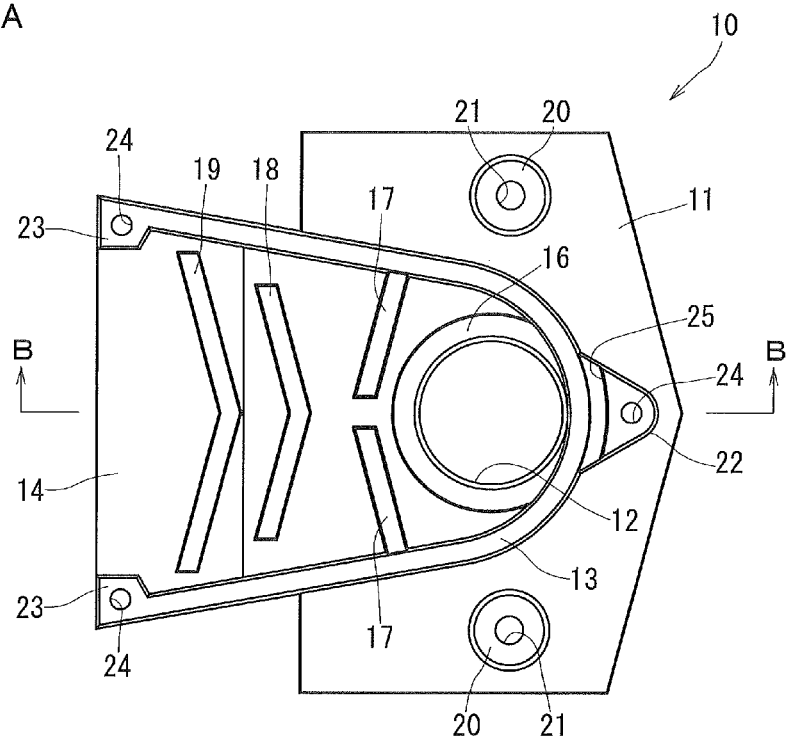
FIG. 2A is a plan view illustrating a main body in the wire lead-in device of FIG. 1
Figure 2B:
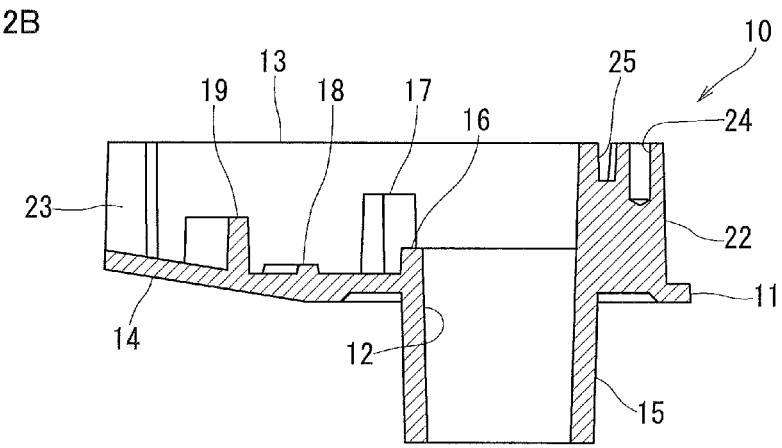
FIG. 2B is a cross-sectional view cut along a line B-B in FIG. 2A.
Figure 3:
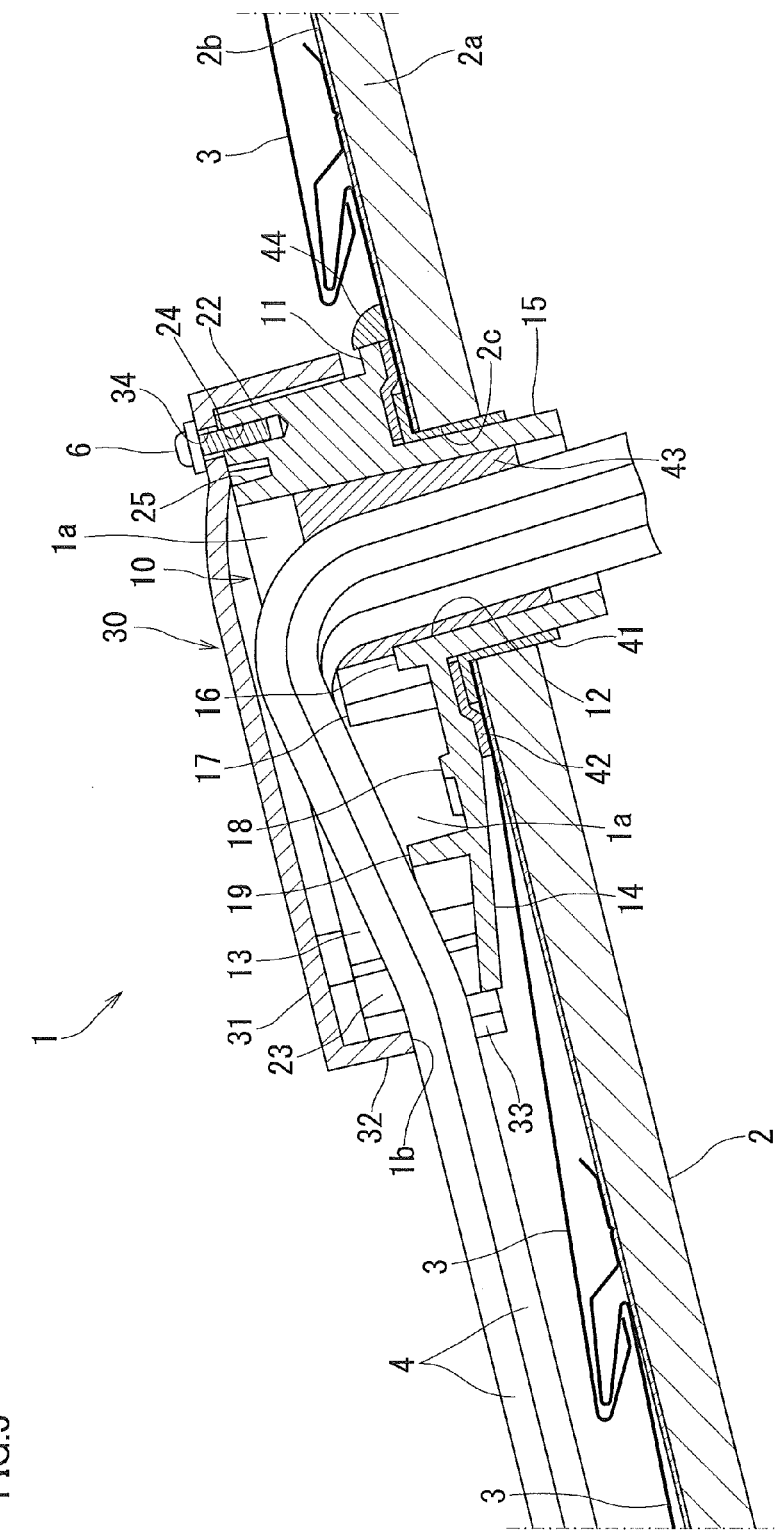
FIG. 3 is a cross-sectional view illustrating a state where the wire lead-in device of FIG. 1 is mounted on a roofing material.
Figure 4:
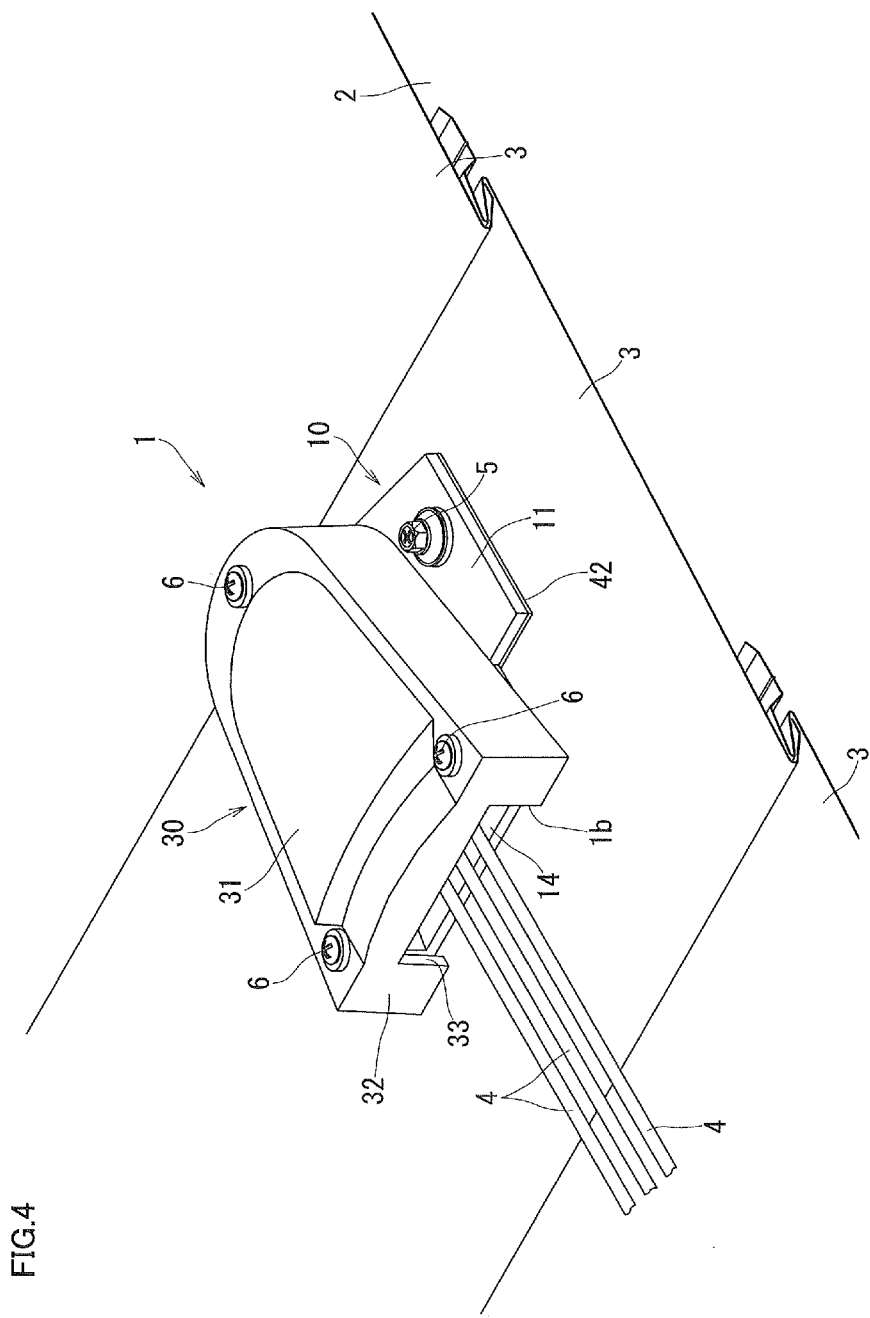
FIG. 4 is a perspective view illustrating the state where the wire lead-in device of FIG. 1 is mounted on the roofing material.

A wire lead-in device 1 as an embodiment of the present invention will be described in detail with reference to FIG. 1 to FIG. 3. The wire lead-in device 1 in the embodiment is a device for leading wires 4 into a building from the upper side of roofing materials 3 laid on a roof structural member 2. In FIG. 1 to FIG. 3, transversely roofed metal roofs are illustrated as the roofing materials 3. The wire lead-in device 1 in the embodiment includes a main body 10 arranged on the roofing material 3 and a lid member 30 covering the upper surface of the main body 10. As illustrated in FIG. 3, the roof structural member 2 includes a plate-like roofboard 2a that is mounted at the upper side of rafter (not illustrated) and a sheet-like covering member 2b that covers the upper surface of the roofboard 2a and has waterproofing performance.

The main body 10 of the wire lead-in device 1 includes a transversely long plate-like base part 11, an insertion hole 12, and a peripheral wall 13. The base part 11 is placed on the roofing material 3. The insertion hole 12 penetrates through the base part 11 at the center position in the right-left direction (direction orthogonal to the roof flow direction) and through which the wires 4 can be inserted. The peripheral wall 13 surrounds right, left, and ridge sides of the wires 4 passing through the insertion hole 12 and extending to the eaves side along the roofing material 3, extends upward from the upper surface of the base part 11, and extends to the eaves side relative to the eaves-side edge of the base part 11. As illustrated in FIG. 2 and the like, the ridge-side edge of the base part 11 of the main body 10 is formed into a V-shaped form such that the center thereof projects to the ridge side. The ridge-side edge of the base part 11 of the main body 10 is formed symmetrically with respect to a center line (not illustrated) passing through the center of the insertion hole 12 and extending in the roof flow direction. In the embodiment, the inner diameter of the insertion hole 12 is approximately five times as the diameter of each wire 4.

Lower ends of portions of the peripheral wall 13 of the main body 10, which extend to the eaves side relative to the eaves-side edge of the base part 11, are inclined upward toward the eaves side. Further, the peripheral wall 13 has a substantially U shape extending linearly toward the eaves side from both ends of a semi-circular arc form, which has a diameter larger than that of the insertion hole 12, when seen from the above. A distance between right and left opposing walls of the peripheral wall 13 is longer, the closer it is toward the eaves side. The center of the semi-circular arc form of the peripheral wall 13 at the ridge side is located at the eaves side relative to the center of the insertion hole 12. The insertion hole 12 is arranged so as to make substantially contact with the inner wall of the peripheral wall 13 at the ridge side.

Further, the main body 10 includes a plate-like inclined bottom wall 14. The inclined bottom wall 14 couples obliquely inclined lower ends of the peripheral wall 13. The inclined bottom wall 14 extends to the eaves-side end portions of the peripheral wall 13 from the eaves-side edge of the base part 11. As illustrated in FIG. 3 and the like, the main body 10 is configured such that the upper surface of the inclined bottom wall 14 is lower at the eaves side rather than at the ridge side in a state where the main body 10 is mounted on the roofing material 3.

Further, the main body 10 includes a cylindrical guide part 15 and a cylindrical bank part 16. The guide part 15 extends downward from the peripheral edge of the insertion hole 12 on the lower surface of the base part 11 to the lower than the roof structural member 2 while penetrating through the roofing material 3 and the roof structural member 2 (roofboard 2a), and the wires 4 can be inserted through the guide part 15. The bank portion 16 extends upward from the peripheral edge of the insertion hole 12 on the upper surface of the base part 11 so as to be lower than the peripheral wall 13. As illustrated in FIG. 1 and FIG. 2, the outer circumference of the bank part 16 at the ridge side is embedded in the peripheral wall 13. Further, the height of the bank part 16 is approximately one-fifth of the height from the upper surface of the base part 11 to the upper end of the peripheral wall 13.

The main body 10 further includes a pair of first standing walls 17, a second standing wall 18, and a third standing wall 19 that are arranged at the eaves side relative to the bank part 16 in this order between the bank part 16 and the eaves-side end portion. The first standing walls 17, the second standing wall 18, and the third standing wall 19 extend upward from the upper surface of the base part 11 or the inclined bottom wall 14 so as to be lower than the peripheral wall 13 and are formed into a plate form. The pair of first standing walls 17 extend obliquely from the opposing inner walls of the peripheral wall 13 to the center line side and the eaves side. Note that the center line passes through the center of the insertion hole 12 and extends in the roof flow direction. The ends of the pair of first standing walls 17, which are closer to the center line, are free ends. The height of the first standing walls 17 is approximately three-fifth of the height from the upper surface of the base part 11 to the upper end of the peripheral wall 13.

Further, the second standing wall 18 extends obliquely from the center line toward the inner wall sides of the peripheral wall 13 and the eaves side in the right-left direction at the eaves side relative to the pair of first standing walls 17. The ends of the second standing wall 18, which are closer to the peripheral wall 13, are free ends. The height of the second standing wall 18 is approximately one-tenth of the height from the upper surface of the base part 11 to the upper end of the peripheral wall 13.

Further, the third standing wall 19 extends obliquely from the center line toward the inner wall sides of the peripheral wall 13 and the eaves side in the right-left direction at the eaves side relative to the second standing wall 18. The ends of the third standing wall 19, which are closer to the peripheral wall 13, are free ends. The third standing wall 19 is formed to be substantially in parallel with the second standing wall 18 when seen from the above. The height of the third standing wall 19 is approximately two-fifth of the height from the upper surface of the base part 11 to the upper end of the peripheral wall 13.

The main body 10 in the embodiment includes boss parts 20 having circular truncated cone shapes and mounting holes 21. The boss parts 20 project upward from the upper surface of the base part 11 at both the right and left sides of the peripheral wall 13. The mounting holes 21 penetrate through the boss parts 20 at the center in the up-down direction. As illustrated in FIG. 1 and the like, the main body 10 can be mounted on the roofing material 3 by screwing mounting screws 5 into the roof structural member 2 through the mounting holes 21 and the roofing material 3 from the upper side.

Further, the main body 10 includes a ridge-side securing part 22, a pair of eaves-side securing parts 23, and screw holes 24. The ridge-side securing part 22 bulges to the ridge side in a triangular prism form from the ridge-side end of the semi-circular arc form of the peripheral wall 13. The pair of eaves-side securing parts 23 bulge from the eaves-side end portions of the peripheral wall 13 toward the center line passing through the center of the insertion hole 12 and extending in the roof flow direction. The screw holes 24 are formed on the upper surfaces of the ridge-side securing part 22 and the eaves-side securing parts 23 and are holes for securing the lid member 30. The ridge-side securing part 22 and the eaves-side securing parts 23 are formed such that the heights of the upper surfaces thereof are the same as the height of the upper surface of the peripheral wall 13.

The main body 10 includes a groove 25. The groove 25 is recessed downward along the outer circumference of the peripheral wall 13 between the peripheral wall 13 and the ridge-side securing part 22. The groove 25 guides rainwater flown down from the ridge side to both the right and left sides of the outer circumference of the peripheral wall 13 so as to make the rainwater difficult to enter the inner portion of the main body 10. Further, the groove 25 suppresses failure due to contraction of a material as less as possible when the main body 10 is manufactured by cast, die cast, injection molding.

The inclined bottom wall 14 of the main body 10 in the embodiment is inclined by approximately 9 degrees with respect to the bottom surface of the base part 11. With this, the upper surface of the inclined bottom wall 14 is set to be lower at the eaves side rather than at the ridge side even when the main body 10 is mounted on the roofing material 3 at any inclination angle. Therefore, even if rainwater enter the inner portion of the main body 10, the rainwater can be discharged to the outside through an opening 1b on the eaves-side end portion through which the wires 4 pass. This can prevent the rainwater from causing generation of odor or the wire lead-in device 1 and the wires 4 from being eroded.

The lid member 30 of the wire lead-in device 1 includes a top board 31, a drooping wall 32, a cutout part 33, and securing holes 34. The top board 31 covers the upper surfaces of the peripheral wall 13, the ridge-side securing part 22, and the eaves-side securing parts 23 of the main body 10. The drooping wall 32 droops from the outer circumference of the top board 31 over the entire circumference so as to surround the outer circumference of the peripheral wall 13. The cutout part 33 is formed by deleting an eaves-side end portion of the drooping wall 32 from the lower end toward upward by a predetermined width. The securing holes 34 are formed at positions corresponding to the screw holes 24 of the main body 10 and penetrate through the top board 31.

The top board 31 is formed such that the inner circumference thereof is larger than the outer circumference of the peripheral wall 13 when seen from the above. Further, a portion of the top board 31 at the inner side relative to the outer circumference of the peripheral wall 13 is curved upward in a state where the lid member 30 covers the main body 10.

The lid member 30 can be mounted on and secured to the main body 10 by putting the lid member 30 on the peripheral wall 13 of the main body 10 from above and screwing securing screws 6 into the screw holes 24 of the main body 10 through the securing holes 34 from above.

The wire lead-in device 1 in the embodiment includes a guiding path 1a capable of guiding the plurality of wires 4. The guiding path 1a is formed by the insertion hole 12 formed into a cylindrical form by the guide part 15 and the bank part 16, the base part 11, the peripheral wall 13, and the inclined bottom wall 14 of the main body 10 and the top board 31 of the lid member 30. The wire lead-in device 1 includes the opening 1b through which the plurality of wires 4 can pass. The opening 1b is formed by the peripheral wall 13 and the inclined bottom wall 14 of the main body 10 and the drooping wall 32 and the cutout part 33 of the lid member 30.

The main body 10 and the lid member 30 of the wire lead-in device 1 in the embodiment are made of aluminum alloy and a coating material excellent in the weather resistance is applied onto the surfaces thereof. It is to be noted that the wire lead-in device 1 may be formed by resin excellent in the weather resistance.

Next, a method of using the wire lead-in device 1 in the embodiment will be described. First, a position of a through-hole 2c (see FIG. 3) and positions of lower holes 2d (see FIG. 1) are marked on the roofing material 3 on which the main body 10 of the wire lead-in device 1 is to be mounted. The through-hole 2c is a hole through which the guide part 15 of the main body 10 is inserted. The lower holes 2d are holes for mounting the main body 10 with the mounting screws 5 through the mounting holes 21. The position at which the main body 10 is to be mounted is desirably a position closer to the roofing material 3 at the ridge side with respect to the roofing material 3 on which the main body 10 is to be mounted as much as possible. Further, the positions of the through-hole 2c and the lower holes 2d can be set easily by using a template on which a plan view of the main body 10 is drawn.

Then, the through-hole 2c and the lower holes 2d are bored so as to penetrate through the roofing material 3 and the roof structural member 2 (roofboard 2a) in accordance with the marks on the roofing material 3. It should be noted that the diameter of the through-hole 2c is made larger than the outer diameter of the guide part 15 of the main body 10 by a predetermined amount and the diameter of the lower holes 2d is made smaller than the diameter of the mounting screws 5 by a predetermined amount.

After the through-hole 2c is bored on the roofing material 3 and the roof structural member 2, a waterproofing tape 41 formed by butyl rubber or the like is bonded to the inner circumference of the through-hole 2c in a cylindrical form. When the waterproofing tape 41 is bonded to the through-hole 2c, the upper end of the waterproofing tape 41 is made to project from the upper surface of the roofing material 3 by a predetermined amount (for example, approximately 10 mm). Then, cuts are made on the portion of the waterproofing tape 41, which projects upward from the roofing material 3, at a predetermined interval in the circumferential direction. Thereafter, the waterproofing tape 41 is made into a state of being bent onto the upper surface of the roofing material 3 (see FIG. 1).

Subsequently, in a state where a waterproofing sheet 42 formed by butyl rubber or the like is bonded to the lower surface of the base part 11 of the main body 10, the guide part 15 is inserted through the through-hole 2c of the roofing material 3 from above. Then, in a state where the mounting holes 21 and the lower holes 2d are matched, the main body 10 is placed on the roofing material 3. Thereafter, the mounting screws 5 inserted through the mounting holes 21 of the main body 10 are screwed into the lower holes 2d of the roofing material 3 and the roof structural member 2 from above, so that the main body 10 is mounted on the roofing material 3.

In the embodiment, the roofing material 3 is the thin plate-like metal roof. Therefore, the roofing material 3 is pressurized on the roof structural member 2 by the base part 11 of the main body 10 by screwing the mounting screws 5 into the lower holes 2d. This makes a state where the roofing material 3 is bent from the eaves-side edge of the base part 11 as illustrated in FIG. 3. Further, after the main body 10 is mounted on the roofing material 3, a caulking material 44 formed by silicone resin or the like is applied along the ridge-side edge of the base part 11 so as to prevent rainwater from entering under the base part 11 from the ridge side.

After the main body 10 is mounted on the roofing material 3, the wires 4 are arranged in the main body 10 in a state where the wires 4 are inserted through the insertion hole 12 from above and are bent to the eaves side over the insertion hole 12 so as to extend to the eaves side from the eaves-side end portion of the main body 10. Next, a clay-like sealing member 43 formed by polyolefin-based resin is filled into between the insertion hole 12 of the main body 10 and the wires 4 for waterproofing (see FIG. 3). Then, the lid member 30 is secured to the main body 10 by putting the lid member 30 on the peripheral wall 13 of the main body 10 from above and screwing the securing screws 6 into the screw holes 24 of the main body 10 through the securing holes 34. With this, mounting of the wire lead-in device 1 is completed.

As illustrated in FIG. 3, the wire lead-in device 1 in the embodiment can guide the wires 4 to be made into a state where the wires 4 are lower at the eaves side rather than at the ridge side with respect to the upper surface of the roof structural member 2 by the third standing wall 19 of the main body 10 and the drooping wall 32 of the lid member 30 at the eaves side. FIG. 3 illustrates a state where the wires 4 extending to the eaves side through the opening 1b on the eaves-side end portion of the wire lead-in device 1 extend substantially in parallel with the roof structural member 2 (roofboard 2a) for the convenience. However, the wires 4 extend obliquely downward through the opening 1b actually.

When the lid member 30 is secured onto the main body 10, the lid member 30 may be put and secured after a caulking material formed by silicone resin or the like is applied to the upper surface of the peripheral wall 13.

Thus, in the wire lead-in device 1 in the embodiment, the base part 11 of the main body 10 has a shape extending in the direction orthogonal to the roof flow direction. Therefore, the length of the base part 11 abutting against the roofing material 3 in the roof flow direction can be made shorter than that in the conventional technique. Further, in the wire lead-in device 1 in the embodiment, the inclined bottom wall 14 extending from the eaves-side edge of the base part 11 to the eaves side is formed. Therefore, the size of the opening 1b through which the wires 4 pass, which is configured by the peripheral wall 13 and the eaves-side end portion of the inclined bottom wall 14 of the main body 10, and the eaves-side end portion of the lid member 30, can be made smaller than the total height of the wire lead-in device 1. Accordingly, rainwater can be made difficult to enter the inner portion from the eaves-side end portion.

In the wire lead-in device 1 in the embodiment, the length of the base part 11 in the roof flow direction is made shorter and a portion from the eaves-side edge of the base part 11 to the eaves side is inclined as the inclined bottom wall 14. Therefore, large bending of the metal roof (roofing material 3) and the crushing of the coupling portion between the metal roofs can be avoided. This enables the wire lead-in device to be mounted even on the metal roof preferably.

In addition, the wire lead-in device 1 in the embodiment includes the cylindrical guide part 15 extending downward from the insertion hole 12 integrally with the main body 10. Therefore, the number of parts in the wire lead-in device 1 can be reduced, thereby suppressing increase in the cost.

Further, the wire lead-in device 1 in the embodiment includes the cylindrical guide part 15 extending downward from the insertion hole 12 integrally with the main body 10, so that the insertion hole 12 of the main body 10 can be matched with the through-hole 2c of the roofing material 3 and the roof structural member 2 only by inserting the guide part 15 into the through-hole 2c. The wire lead-in device 1 in the embodiment includes the guide part 15 integrally with the main body 10, thereby reducing the number of places sealed by the sealing member or the like for waterproofing in comparison with the conventional technique. Accordingly, the wire lead-in device 1 can be mounted on the roofing material 3 easily so as to reduce the work period and the cost required for mounting in comparison with the conventional technique.

Moreover, in the wire lead-in device 1 in the embodiment, the lid member 30 includes the drooping wall 32 that extends downward at the eaves side relative to the eaves-side end portion of the main body 10 and forms the upper end of the opening 1b. Therefore, the opening 1b on the eaves-side end portion through which the wires 4 extend in the wire lead-in device 1 can be further made small. With this, rainwater can be made difficult to enter the inner portion from the eaves-side end portion. Further, in the wire lead-in device 1 in the embodiment, the drooping wall 32 of the lid member 30 is capable of guiding the wires 4 downward. This can increase the inclination angle relative to the roofing material 3, which is formed in the wires 4 extending to the eaves side from the eaves-side end portion in comparison with that in the conventional wire lead-in device. With this, rainwater can be made difficult to enter the inner portion while flowing down along the wires 4.

The wire lead-in device 1 in the embodiment can prevent entrance of rainwater into the insertion hole 12 by the bank part 16 that extends from the peripheral edge of the insertion hole 12 even when the rainwater enter the inner portion of the main body 10 accidentally.

Further, the wire lead-in device 1 in the embodiment includes the first standing walls 17, the second standing wall 18, and the third standing wall 19 extending upward and inclined such that free ends thereof is directed toward the eaves side in the main body 10. Therefore, entrance of rainwater is suppressed. Further, even when the rainwater enter the inner portion of the main body 10, the rainwater can be discharged toward from the eaves side free ends of the standing walls 17, 18, and 19 preferably.

The present invention has been described above by using the preferable embodiment. However, the invention is not limited to the above-mentioned embodiment and various improvements and changes in design can be made in a range without departing from a scope of the invention as will be described below.

Figure 5:
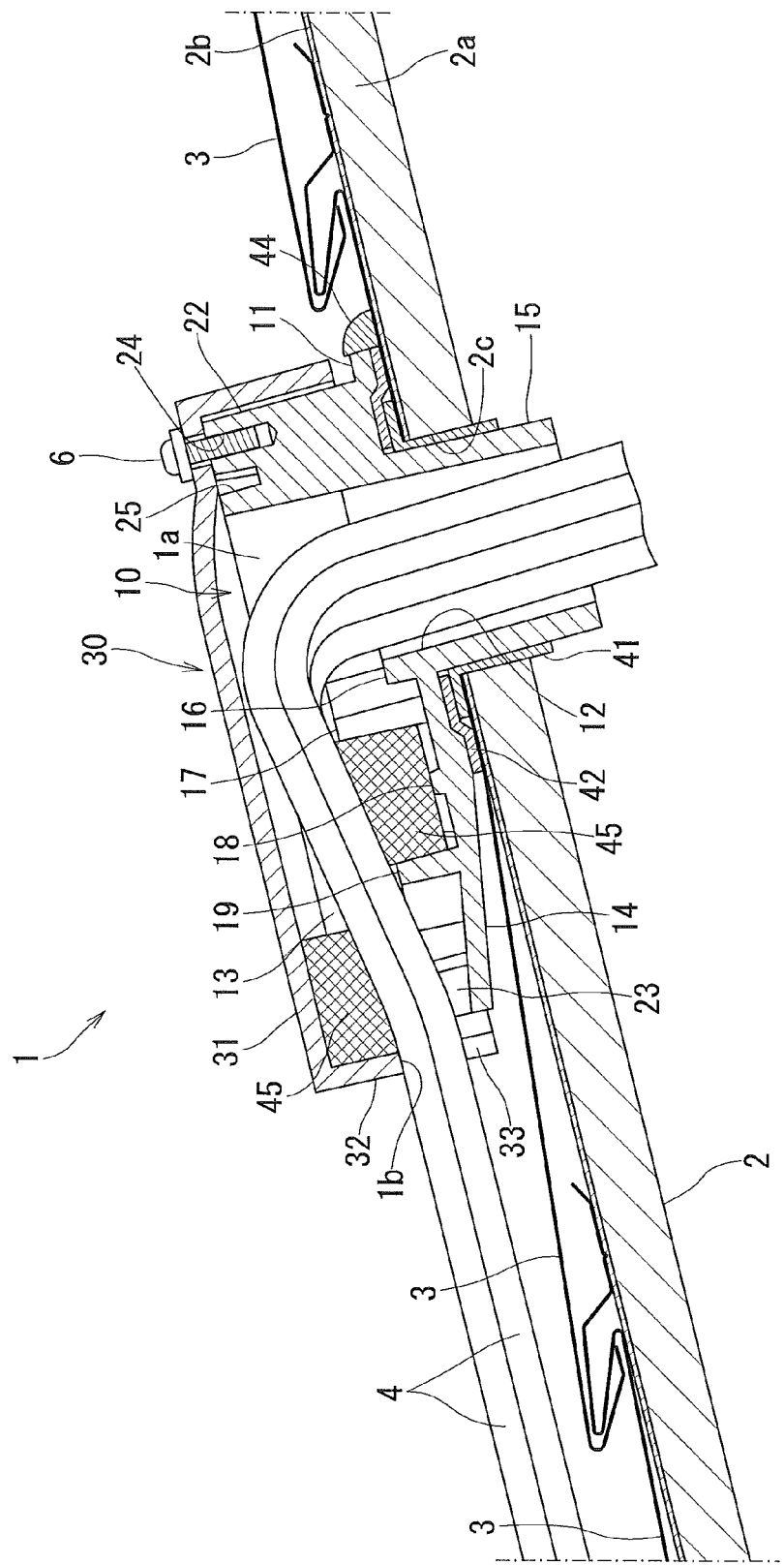
FIG. 5 is a cross-sectional view illustrating an example of waterproofing processing different from that in FIG. 3.

For example, in the above-mentioned embodiment, the clay-like sealing member 43 is filled into between the insertion hole 12 of the main body 10 and the wires 4. However, the invention is not limited thereto. Alternatively, as illustrated in FIG. 5, a waterproofing member 45 formed by foamed rubber obtained by foaming ethylene propylene (EPDM) rubber or the like may be filled into between the first standing walls 17 and the third standing wall 19 under the wires 4 and into between the third standing wall 19 and the drooping wall 32 of the lid member 30 at the eaves side above the wires 4. This can achieve the same effects as those obtained in the above-mentioned embodiment. In the example of FIG. 5, the same reference numerals denote the same constituent components as those in the above-mentioned embodiment and detail description thereof is omitted.

When the waterproofing member 45 is used instead of the sealing member 43, it is sufficient that the waterproofing member 45 is placed on the corresponding places only. This can simplify the mounting operation of the wire lead-in device 1 and reduce the cost. Further, the waterproofing member 45 is placed on the second standing wall 18 between the first standing walls 17 and the third standing wall 19. Therefore, a space is formed between the base part 11 and the waterproofing member 45 and rainwater that have entered the inner portion of the main body 10 can be discharged to the outside from the opening 1b on the eaves-side end portion through the space.

In addition, when the sealing member 43 is not provided, the upper space over the roofing material 3 and the inner portion of the building communicate with each other through the insertion hole 12 of the main body 10. Even when the warm air in the building flows into the main body 10 through the insertion hole 12 and condensation is generated on the lower surface, for instance, of the top board 31 of the lid member 30 under the low temperature environment of winter and the like, condensed water can be made to flow down to the eaves side and be discharged to the outside through the opening 1b on the eaves-side end portion because the eaves-side end portion of the lower surface of the top board 31 of the lid member 30 is lower than the ridge-side end portion thereof in a state where the wire lead-in device 1 is mounted on the roofing material 3. This can prevent the condensed water from entering into the building through the insertion hole 12.

Figure 6:
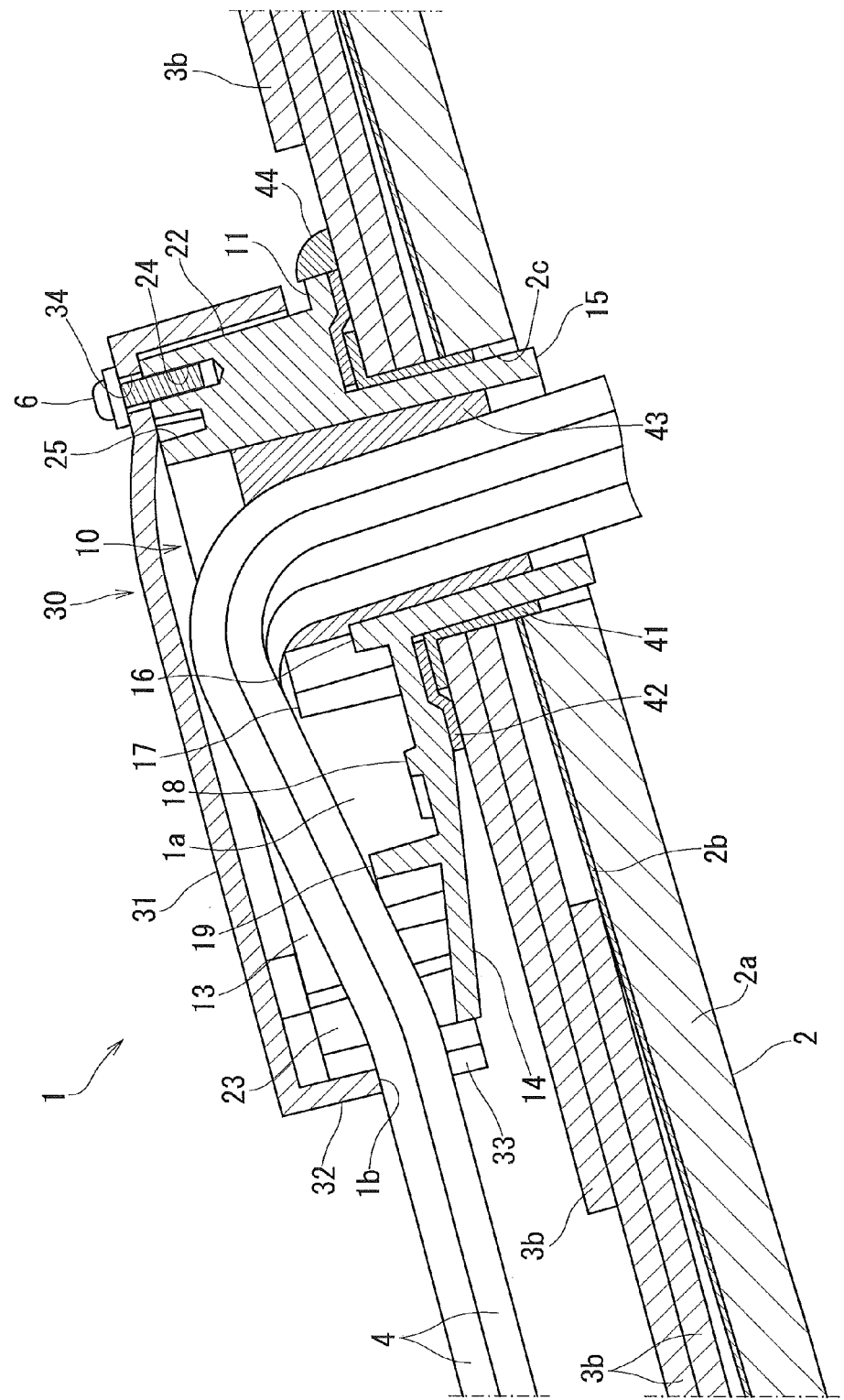
FIG. 6 is a cross-sectional view illustrating a state where the wire lead-in device is mounted on a roofing material that is different from that in FIG. 1.
Figure 7:
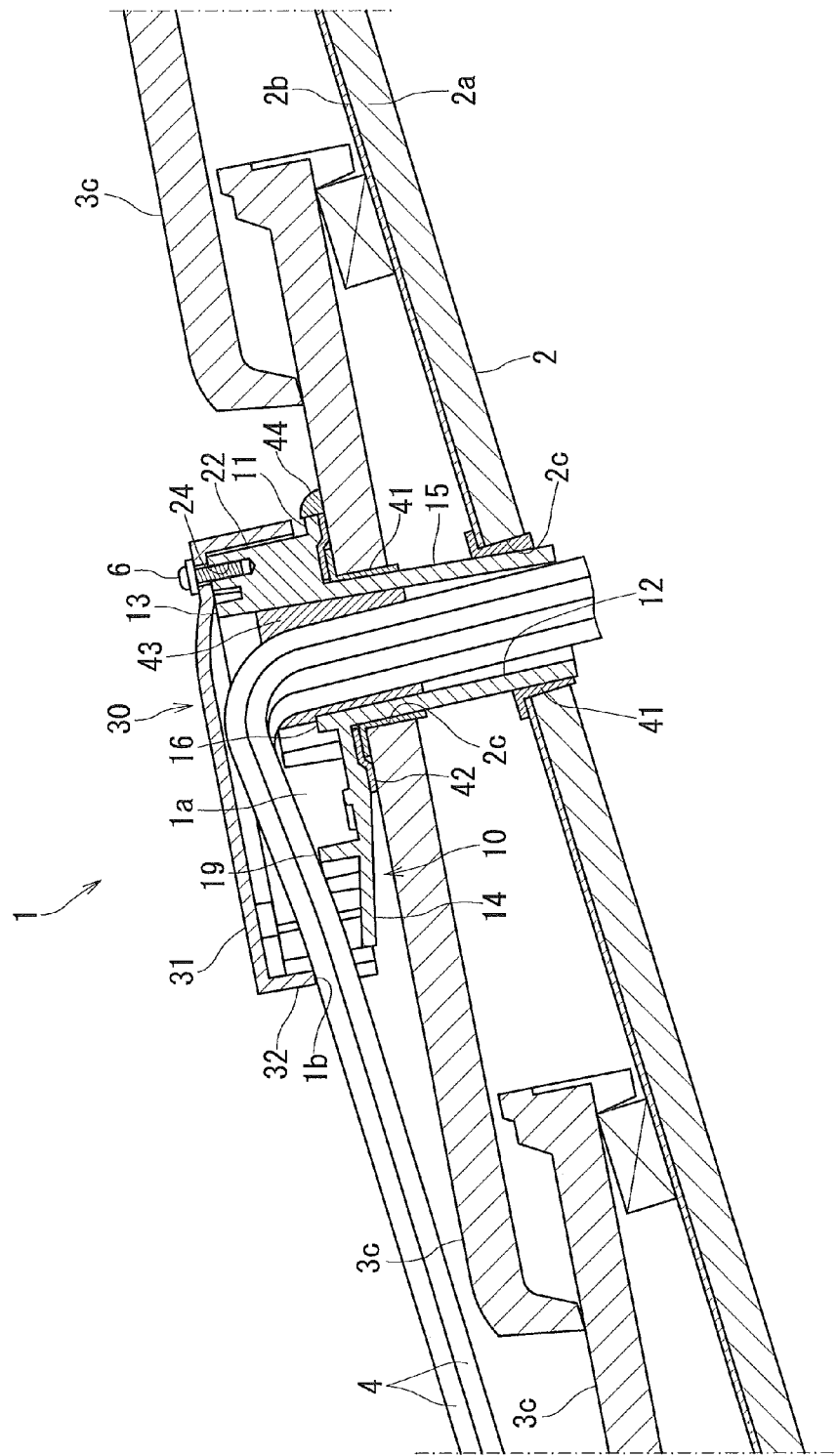
FIG. 7 is a cross-sectional view illustrating a state where the wire lead-in device is mounted on a roofing material that is still different from those in FIG. 1, and FIG. 6.

Further, in the above-mentioned embodiment, the wire lead-in device 1 is mounted on the metal roof as the roofing material 3. However, the invention is not limited thereto. Alternatively, for example, as illustrated in FIG. 6 and FIG. 7, the wire lead-in device 1 may be mounted on a slate 3b or a roof tile 3c as the roofing material. This can achieve the same effects as those obtained in the above-mentioned embodiment. In the examples of FIG. 6 and FIG. 7, the same reference numerals denote the same constituent components as those in the above-mentioned embodiment and detail description thereof is omitted.

In the wire lead-in device 1 in the example of FIG. 7, the guide part 15 of the main body 10 extends downward so as to be longer than that in the above-mentioned embodiment. The lower end of the guide part 15 penetrates through the roof tile 3c as the roofing material and the roofboard 2a of the roof structural member 2 and extends downward from the lower surface of the roofboard 2a. In this example, the main body 10 may be mounted on the roof tile 3c as the roofing material only. Further, the guide part 15 may be formed to be long previously and be used by cutting the guide part 15 into a length in accordance with the roofing material on which the wire lead-in device 1 is to be mounted and the thickness of the roof structural member 2. This can make the guide part 15 available for various roofing materials. Accordingly, the above-mentioned wire lead-in device 1 can be mounted on the roofing materials of the larger number of types and prevent entrance of rainwater as less as possible.

What is claimed is:

1. A wire lead-in device for leading a wire into a building from above a roofing material laid on a roof structural member, comprising:
a main body having a transversely long plate-like base part that is mounted on the roofing material, an insertion hole that penetrates through the base part and through which the wire is capable of being inserted, a peripheral wall that surrounds the wire passing through the insertion hole and extending to an eaves side on the roofing material from right, left, and ridge sides, extends upward from an upper surface of the base part, and extends to the eaves side relative to an eaves-side edge of the base part, and of which lower ends of portions extending to the eaves side relative to the eaves-side edge are inclined upward toward the eaves side, and a plate-like inclined bottom wall that couples the inclined lower ends of the peripheral wall and extends from the eaves-side edge of the base part to the eaves side, and
a lid member that is detachably mounted on the main body and is capable of closing an upper opening of the peripheral wall, wherein the main body further includes a cylindrical bank part that extends upward from a peripheral edge of the insertion hole above an upper surface of the base part so as to be lower than the peripheral wall.

2. The wire lead-in device according to claim 1,
wherein the main body further includes a cylindrical guide part that extends downward from an peripheral edge of the insertion hole below a lower surface of the base part and through which the wire is inserted.

3. The wire lead-in device according to claim 2,
wherein the lid member includes a drooping wall that extends downward at the eaves side relative to an eaves-side end portion of the main body and is capable of guiding downward the wire extending to the eaves side from the eaves-side end portion of the main body.

4. The wire lead-in device according to claim 1,
wherein the lid member includes a drooping wall that extends downward at the eaves side relative to an eaves-side end portion of the main body and is capable of guiding downward the wire extending to the eaves side from the eaves-side end portion of the main body.

* * * * *